US005616179A

United States Patent [19]
Baldwin et al.

[11] Patent Number: 5,616,179
[45] Date of Patent: Apr. 1, 1997

[54] PROCESS FOR DEPOSITION OF DIAMONDLIKE, ELECTRICALLY CONDUCTIVE AND ELECTRON-EMISSIVE CARBON-BASED FILMS

[75] Inventors: David A. Baldwin, Annandale; Stephen L. Michel, Alexandria, both of Va.

[73] Assignee: Commonwealth Scientific Corporation, Alexandria, Va.

[21] Appl. No.: 170,770

[22] Filed: Dec. 21, 1993

[51] Int. Cl.$^6$ .................................................. C30B 29/04
[52] U.S. Cl. ...................... 117/108; 117/929; 204/192.11
[58] Field of Search .................................. 117/108, 929; 204/192.11, 298.04

[56] References Cited

U.S. PATENT DOCUMENTS

| | | | |
|---|---|---|---|
| 3,904,505 | 9/1975 | Aisenberg | 204/298.04 |
| 3,961,103 | 6/1976 | Aisenberg | 204/298.04 |
| 4,486,286 | 12/1984 | Lewin et al. | 204/192.11 |
| 4,490,229 | 12/1984 | Mirtich et al. | |
| 4,526,673 | 7/1985 | Little et al. | 204/192.35 |
| 4,565,618 | 1/1986 | Banks | 204/298.41 |
| 4,862,032 | 8/1989 | Kaufmann et al. | |
| 5,135,808 | 8/1992 | Kimock et al. | |
| 5,190,807 | 3/1993 | Kimock et al. | |

FOREIGN PATENT DOCUMENTS 03274269  12/1991  Japan .

OTHER PUBLICATIONS

M. Tamor, "Diamond and Diamondlike Carbon", Encycl. Appl. Phys., vol. 5 (1993) pp. 11–24.

S. Aisenberg et al, "Ion Beam and Ion–Assisted Deposition of Diamond–like Carbon Films", Mater. Sci. Forum, vols. 52 & 53 (1989) pp. 1–40.

H.R. Kaufmann et al, *Operation of Broad–Beam Ion Sources*, Commonwealth Scientific Corp., Alex. VA (1984) pp. 5–76.

M. Okada et al, "Application of a Hall Accelerator to Diamondlike Carbon Film Coatings", Japan J. Appl. Phys. vol. 31 (1992) pp. 1845–1854.

R.S. Robinson et al, "Hall Effect Ion Sources" in *Handbook of Ion Beam Processing Technology*, J.J. Cuomo et al (eds.), Noyes Publications, Park Ridge, NJ (1989) pp. 39–57.

H.R. Kaufmann et al, "End–Hall Ion Source", J. Vac. Sci. Technol. A 5 (1987) pp. 2081–2084.

M.J. Mirtich, "Ion Beam Deposited Protective Films", NASA Technical Memorandum 81722 (1981).

M.J. Mirtich, D.M. Swec and J.C. Angus, "Dual Ion Beam Deposition of Carbon Films with Diamondlike Properties", NASA Technical Memorandum 83743 (1984).

M.J. Mirtich, M.T. Kussmaul, B.A. Banks and J.S. Sovey, "Dual Ion Beam Processed Diamondlike Films for Industrial Applications", NASA Technical Memorandum (1990).

M.J. Mirtich, M.T. Kussmaul, J.S. Sovey, B.A. Banks, "Making Diamondlike Films More Transparent", NASA Tech Briefs, p. 46 (1994).

Committee on Duperhard Materials, National Materials Advisory Board, National Research Council, "Status and Applications of Diamond and Diamond–Like Materials: An Emerging Technology", Bulletin NMAB–445, Natioanl Academy Press (1990) pp. 43–59.

F.M. Kimock and B.J. Knapp, "Commercial Applications of Ion Beam Deposited Diamond–Like Carbon (DLC) Coatings", Proceedings of the ICMC Thin Films Conf., in Surface Coatings Technology, (1992).

*Primary Examiner*—Robert Kunemund
*Attorney, Agent, or Firm*—Wigman, Cohen, Leitner & Myers, P.C.

[57] ABSTRACT

A process for depositing amorphous or nanophase diamondlike carbon (DLC) and a-C:H carbon/hydrogen films with variable and controllable properties on the surface of a substrate is disclosed. The process utilizes a combined hydrocarbon ion beam and plasma-activated hydrocarbon gaseous radical flux produced by an end-Hall ion source to yield a film with good electron-emissivity characteristics or high hardness and good optical transparency, as desired. A second ion source providing a beam of argon ions above or together in nitrogen is optionally directed at the substrate for cleaning prior to deposition and for ion-assisted deposition during deposition or for doping.

34 Claims, 2 Drawing Sheets

END-HALL ION SOURCE

PROCESS FOR DEPOSITION OF DIAMONDLIKE, ELECTRICALLY CONDUCTIVE AND ELECTRON-EMISSIVE CARBON-BASED FILMS

BACKGROUND OF THE INVENTION

This invention relates generally to a process for making and depositing thin films of predominantly carbon with a gas phase plasma and ion beam conducted in a vacuum chamber and the resulting thin carbon films. The deposited carbon can possess many of the properties of diamond, of graphite, of hydrocarbon polymers or can have combined properties of, or intermediate properties, between diamond, graphite and polymers.

Procedures which are known for depositing thin carbon films on substrates include ion beam sputter deposition, magnetron sputtering, electron beam evaporation, plasma dissociation and others. Moreover, U.S. Pat. Nos. 4,541,890 (Cuomo et al) and 4,862,032 (Kaufman et al) each disclose end-Hall ion source systems for generating plasmas and extracting ions, the subject matter of which is incorporated herein by reference.

Amorphous carbon-based materials (a-C), the most prominent member of which is diamondlike carbon (DLC), have been described by M. Tamor in "Diamond and Diamondlike Carbon", Encycl. Appl. Phys. 5, pp. 1–24 (1993). According to Tamor, DLC is not a single material but is a broad class of materials which has properties suggestive of diamond, such as, high mechanical hardness, low coefficient of friction in sliding couple with steel, high dielectric constant, high electrical resistivity, chemical inertness and high transmittance at visible wavelengths. However, the measured value of each of these properties has been found to be continuously variable over quite a large range in DLC specimens that have been prepared in slightly different fashions. The variability in properties has been attributed to differences in the type of chemical bonding adopted by carbon in the materials. The range of property variations while retaining the same elemental composition varies greatly from fully electrically insulating to near-graphitic conductivity, such that, the name DLC does not adequately describe the class of materials. The term DLC is merely descriptive of a property of the harder members of the class whereas a-C is more representative of carbon-based materials that are deposited under conditions of kinetically energetic atomic or molecular bombardment during the film growth, particularly electrically accelerated ion bombardment. Thus, a-C would cover both amorphous and/or polyphase carbon with phase domain sizes on the order of nanometers wherein the main distinction between phases is the carbon chemical bond type. Although fully accepted nomenclature for the entire class has not been adequately developed, Tamor describes the plethora of nomenclature that does exist.

As used herein, the designations a-C and a-C:H, refer to amorphous carbon and amorphous carbon/hydrogen, both of which are believed to be deposited in the presence of energetic bombardment.

Categorization of a-C and a-C:H materials has been attempted by its properties, by the deposition method used, by hydrogen content, and by chemical bonding type. Thus, Aisenberg et al in "Ion Beam and Ion-Assisted Deposition of Diamond-like Carbon Films", Mater. Sci. Forum 52 & 53 (1989), pp. 1–40, have proposed categorization of a-C and a-C:H materials into those without hydrogen (a-C) and those with hydrogen (a-C:H) incorporated into the film. Because the range of properties of a-C and a-C:H materials overlap, categorization by chemical bonding has been suggested. Carbon atoms can individually assume either a three-fold, planar bonding pattern, ($sp^2$ hybridization) or a four-fold, tetrahedral bonding pattern ($sp^3$ hybridization). Graphite has three-fold, $sp^2$ bonding whereas diamond has four-fold, $sp^3$ bonding. In a-C and a-C:H materials, these two types of bonding are combined in an intimately mixed amorphous structure. In carbon polymers, hydrogen allows termination of carbon one-dimensional chains, two-dimensional sheets and three-dimensional blocks by simple single bonds to hydrogen. This introduces new ranges of elastic and plastic mechanical properties and is available in hydrogenated a-C:H. Therefore, by controlled combination of diamond, graphite and polymer types of bonding, a wide range of material properties can be obtained.

To obtain a-C:H films Mirtich et al (U.S. Pat. No. 4,490,229) uses two dual gridded Kaufman-type ion sources in which one ion source emits a combined argon/hydrocarbon ion beam at ≈100 eV and large current density while a required second ion source emits an argon ion beam at 200 to 500 eV and small current densities. Mirtich et al describes an initial phase of growth of a-C:H films. Thereafter, the ion current density is increased after the initial phase of growth is complete.

Commonwealth Scientific Corp. (CSC) of Alexandria, Va., Assignee of the present application, manufactures and sells gridless end-Hall ion sources, e.g., Mark I, Mark II, Mark III, for depositing oxide and nitride films into various substrates.

CSC as well as other companies also sell dual gridtied Kaufman-type ion sources, the source described by Mirtich et al. The differences between the principles of operation of the gridless end-Hall and the dual gridtied Kaufman-type ion sources are summarized by H. R. Kaufman et al, in *Operation of Broad-Beam Ion Sources*, Commonwealth Scientific Corp., Alexandria, Va., (1984), pp. 5–76. It is believed that these differences produce fundamentally different mechanisms of electron transport and ion acceleration causing different deposition characteristics.

The deposition of a-C:H using a Hall effect ion source is described by M. Okada et al, in "Application of a Hall Accelerator to Diamondlike Carbon Film Coatings", Japan J. Appl. Phys. 31 (1992) pp. 1845–1854. However, the type of Hall effect ion source used by Okada et al is as a "closed-drift" source, as distinguished from the end-Hall source according to the present invention. The operational differences between the two mentioned sources are summarized by R. Robinson et al in "Hall Effect Ion Sources" in *Handbook of Ion Beam Processing Technology*, J. J. Cuomo et al (eds.), Noyes Publications, Park Ridge, N.J. (1989) pp. 39–57. Simply stated, the Okada et al closed-drift source is considerably different than the end-Hall source of the present invention, as will be discussed more fully hereinafter.

From the aforementioned, it will be seen that up until the present invention persons skilled in the art failed to recognize the advantages of utilizing the gridless, end-Hall source for depositing carbon based films on substrates. Nor did the prior art recognize that such utilization of an end-Hall source would produce carbon based coated substrates with good electrically conductive and electron-emissive properties.

SUMMARY AND ADVANTAGES OF THE INVENTION

A primary object of the present invention is to provide a process for depositing diamondlike carbon films and conductive carbon films with variable and controllable properties on the surface of a substrate.

Another object is to provide substrates coated with carbon based films having good electrically conductive and electron-emissive properties using an end-Hall ion source.

Still another object of the present invention is to provide a process which yields hydrogenated a-C:H film when a hydrocarbon feedstock is used as the source of both the carbon and the hydrogen using an end-Hall generator.

The present invention requires the use of an end-Hall effect ion source to perform the subject process. No secondary ion source or gas mixtures are necessary to produce a-C:H in the present invention, though they may be used, if desired. The end-Hall source used in the present invention is functionally different than the Okada et al closed-drift source for several important reasons.

Firstly, the magnetic field and electric field design principles are different for the two types of source. Generically, the closed-drift source maintains a nearly perpendicular orientation between the magnetic field vector B and the applied electric field vector E, while the end-Hall design places these two vectors parallel except for the controlled divergence of the magnetic field near the exit aperture. This difference is partially responsible for the different ion energy distribution produced by each source as can be seen by comparing the published ion energy distributions in the respective papers cited above. Secondly, there is a difference in ion energy distributions between the Okada et al closed-drift source and the end-Hall used in the present invention due to the fact that the Okada et al source has no explicit source of free electrons. Rather, the Okada et al source is operated at a high pressure (4 to 10 Pa), such that, a DC glow discharge between the cathode and anode would be self-sustaining without a source of free electrons. By contrast, the end-Hall source of the present invention employs either an incandescent tungsten filament or a hollow cathode discharge as the cathode for emitting free electrons which are then utilized to ionize the working gas in the source. Because of this, the gas pressure in the source of the present invention is considerably lower (0.01 to 0.1 Pa). The lower pressure in the end-Hall source of the present invention allows a longer mean free path for the accelerated ions emitted from the source between collisions with other neutral gas molecules in the process chamber. Accordingly, it is believed that most ions reach the substrate without making any collisions. By contrast, the higher pressures in the Okada et al source will reduce and broaden the ion energy distribution. Another consequence of the fact that the Okada et al source has no source of free electrons is that the voltage which is applied between the cathode and the anode is quite high, 500 to 1000 volts. By contrast, the source used in the present invention operates at 50 to 175 volts between the cathode and the anode. Therefore, the Okada et al source and the present end-Hall source differ both in principal of operation and in range of process parameters employed which yield different results.

According to the present invention, when using the end-Hall ion source as the source of carbon for a-C:H films, it is not necessary to use one ion current density during the initial phase of growth and then a different ion current density after that as is suggested by Mirtich et al. High quality a-C:H films have been obtained with the end-Hall source when the ion current density was kept constant throughout.

The important features of the end-Hall effect ion source which contribute to the present invention include the following:

1. The plasma beam acceleration retains quasi-neutrality.
2. The ranging energy distribution of the hydrocarbon-based positive ions in the beam.
3. The low pressure of operation of the ion source such that most species emitted from the end-Hall source traverse to the substrate without making any gas phase collisions involving subsequent energy loss.
4. The emission of neutral activated molecules, molecular radicals and fragments and free atoms derived from the discharge of hydrocarbon gases and the projection of these neutral species from the ion source such that they arrive at the substrate during a-C:H deposition.

According to the process of the present invention, a combined hydrocarbon ion beam and plasma-activated hydrocarbon gaseous radical flux is produced using an end-Hall ion source. The controllable parameters of the process determine the type of carbon film produced. The significant process parameters are hydrocarbon ion energy, hydrocarbon gas pressure, hydrocarbon plasma power and the substrate surface temperature. Typically, hydrocarbons such as methane, ethane, propane, ethylene, acetylene, higher hydrocarbons, as well as commercially available natural gas and LP gas, may be used. Methane is preferred.

A second ion source may be optionally used to provide a beam of argon ions at the substrate for cleaning prior to deposition and for ion-assisted deposition. If desired, argon ions may be also generated with the end-Hall ion source for substrate cleaning prior to deposition. The second ion source may also be used with pure nitrogen or with argon/nitrogen gas mixtures for doping the carbon film with nitrogen simultaneous with the other benefits arrived at with pure argon ion bombardment. Nitrogen doping may also be accomplished by adding nitrogen gas to the hydrocarbon gas supplied to the end-Hall ion source using conventional gas mixing techniques. Nitrogen doping improves mechanical and electrical properties, particularly reducing the film stress allowing thicker films to be deposited while still maintaining high optical transmittance and electrical resistivity. Hydrogen gas may also be introduced during deposition of diamondlike carbon to help prevent formation of graphite-like chemical bonds. A deposition source of any of several types may optionally be used to apply a thin interfacial layer upon the substrate surface before or during the earl stages of a-C:H deposition to increase the adhesion of the a-C:H film to the substrate. The addition of an interlayer between a substrate and the deposited film per se, is well-known in the art. See, e.g., U.S. Pat. Nos. 5,135,808 and 5,190,807.

After methane is introduced into the discharge chamber, a discharge is established between the cathode and anode of the end-Hall source. Where argon is also added, the methane:argon molar ratio ranges from about 1:100 to about 1:1, with a ratio of 1:10 being preferred.

The ion beam energy is about 100 eV. Current densities range from 1 mA/cm$^2$ at a distance of 20 cm axially downstream of the end-Hall source. Under these conditions, a-C:H films are deposited on the substrate at the rate of 700Å/min yielding film thicknesses of between 50 Å to about 10 micrometers.

The rate of deposition and the film thickness may be varied depending on the total ion current and reactive neutral flux emitted from the end-Hall source, the distance of the substrate from the source and the time duration over which the deposition is conducted. The total ion current and reactive neutral flux emitted from the end-Hall source is controlled by varying the gas flow rate into the source and the power supplied to the electrical discharge in the source, in accordance with the manufacturer's recommendations and the inherent limitations of the end-Hall source used. In the end-Hall source used in present invention, the gas flow rate ranges from 50 sccm and below, and the total electrical power supplied to the plasma discharge ranges from 1500 watts and below; this produces a total ion current ranging from 1 ampere and below, and a reactive neutral flux of the same magnitude, i.e., $10^{18}$ to $10^{19}$ molecules or atoms per second. The rate of deposition can range from 2000 Å/min if the substrate is placed within a few centimeters of the end-Hall source to lower values as the substrate is moved away from the source. At a typical distance of the substrate from the source, the deposition rate is 500 Å/min, so a 1000 Å thick a-C:H film will be deposited in 2 min and a 1 μm thick film will be deposited in 20 min.

Additionally, the characteristics of the deposited film may also be varied. The primary control over a-C:H film properties is the ion energy provided by the end-Hall ion source. Without being bound by a particular theory, it is believed that when the average energy per deposited carbon atom is about 100 eV, then hard, substantially optically transparent, electrically resistive and non-electron-emissive a-C:H is produced. When the average energy per deposited carbon atom is about 50 eV, then softer, partially optically dense, electrically conductive and electron-emissive a-C:H is produced. In particular, for the end-Hall source used in the present invention, nominal or peak ion energy, $V_{anode}$ of about 150 eV gives hard, non-electron-emissive a-C:H while $V_{anode}$ of about 90 eV gives softer, electron-emissive a-C:H. One reason that $V_{anode}$ values must be higher than expected is that there is a particular range of ion energies produced at any given V and there are low energy, reactive neutral species present as well; these lower energy species reduce the average energy per carbon atom deposited. Properties between the hard, non-electron-emissive and the softer, electron-emissive a-C:H materials can also be obtained.

The characteristics of the deposited film may be varied by introducing a third species or component to the deposition. With ion assisted deposition by argon ions from a second ion source, the addition of energy by the supplementary argon ion beam allows the production of hard, non-electron-emissive a-C:H at lower hydrocarbon ion energies, or lower energy-per-carbon-atom-deposited as occurs when the end-Hall source is used with higher hydrocarbons, e.g., ethane, propane, etc. When nitrogen doping is added to the a-C:H film, stress in the film is reduced, much as would happen if lower hydrocarbon ion energy was used, but good optical transparency and high electrical resistivity are maintained. Some reduction in hardness occurs with nitrogen doping, but this allows the depositing of much thicker layers; often high film stress causes loss of adhesion of the film, limiting film thickness. Hydrogen gas ($H_2$) added to the process chamber may also improve the hardness and optical transparency of hard, non-electron-emissive a-C:H.

The present process has produced all of the commonly known varieties of hydrogen-containing a-C:H. However, the present process using the end-Hall ion source is superior to conventional methods in a number of respects:

higher ion current density, much higher deposition rate;

broader area of beam coverage and easier scale up of substrate size;

absence of grids gives simpler device and avoids contamination from grids;

lower pressure operation compared with closed-drift Hall source;

more rugged design compared with gridded source;

simpler and cheaper construction than closed-drift Hall source;

full neutralization is inherent and automatic compared with gridded source;

ion energy distribution contains both low energy ions and a high energy component of the beam which gives proper amount of high energy ion bombardment—this would normally remove the need for a second ion source for argon or other ion bombardment for ion-assisted deposition;

more intense discharge—produces higher amounts of plasma-activated hydrocarbon neutrals compared with gridded sources;

more efficient discharge gives less radiant heat at substrate surface;

source is more tolerant of process deposits, gives longer service lifetime; and cheaper source construction and cheaper power supply.

The end-Hall source produces a high flux of carbon-containing, ionized and neutral excited gas that contains the material, energy and directionality to provide controllable a-C:H film properties at deposition rates beyond normal gridded ion source ranges. This material/device/process combination produces useful materials outside the capability of currently available ion beam art.

The carbon-based films made in accordance with this invention have properties not found in diamond, graphite or polymers, such as, electron emissivity in the presence of relatively modest electric fields and extremely smooth surfaces as deposited. The thickness of such films may be between about 10 Å to about 20 μm or more.

It has been observed that the thickness of a-C:H film built up on the substrate is approximately a factor of two greater than can be accounted for by the ion current to the substrate alone. Even if all of the ion current was assumed to be carbon containing, which is certainly not true if methane is used as the feed gas for the end-Hall ion source (some $H^+$ and $H_2^+$ will be produced by the electron impact ionization and gas phase collisions in the ionizing region of the ion source), and a low density (2.2 g cm$^{-3}$) is assumed for the a-C:H deposited, the expected deposition rate is about half of what is measured. Without being bound by a particular theory, it is believed that the carbon being deposited over and above the carbon from the ion flux comes Such activated species may be atoms or molecular fragments (·$CH_x$ radicals) or from neutral, activated hydrocarbon gaseous species from the end-Hall ion source. electronically or vibrationally excited feed gas molecules (e.g., $CH_4$*). Since low pressure plasmas are known to be efficient producers of such species and because the system pressure is kept low, the degree of recombination is low, thereby allowing these species to survive and to reach the surface of the substrate where deposition occurs.

If argon or other ion bombardment sputter cleaning of the substrates prior to deposition is performed, it may be carried out using either the end-Hall ion source or a secondary ion source. If an interfacial layer for adhesion is desired, the deposition source is operated after cleaning to apply this layer. Two variants over and above the deposition of a simple interfacial layer involve 1) intermixing the interfacial layer with the topmost atomic layers of the substrate via high energy (>500 eV) ion bombardment from a secondary ion source and 2) continuing to operate the interfacial layer deposition source while a-C:H deposition is started to intermix the interfacial material with the a-C:H.

With the foregoing and other objects, advantages and features of the invention that will become hereinafter apparent, the nature of the invention may be more clearly understood by reference to the following detailed description of the invention, the appended claims and to the several views illustrated in the attached drawings.

A wide variety of known substrates may be used with the process of this invention. For example, ceramic and semiconductor materials, e.g., silicon, silica, glass, aluminum oxide, germanium; polymeric materials, e.g., polycarbonate, polyimide, polyamide, polyester, acrylic plastics; metals, e.g., stainless steel, chrome plated metals, aluminum, titanium, nickel-iron alloys (permalloy), nickel-chrome alloys, are contemplated.

BRIEF DESCRIPTION OF THE DRAWINGS

For a more complete understanding of the present invention, reference may be made to the drawings which are incorporated herein by reference, and in which.

BEST MODE FOR CARRYING OUT THE INVENTION

Figure 1:
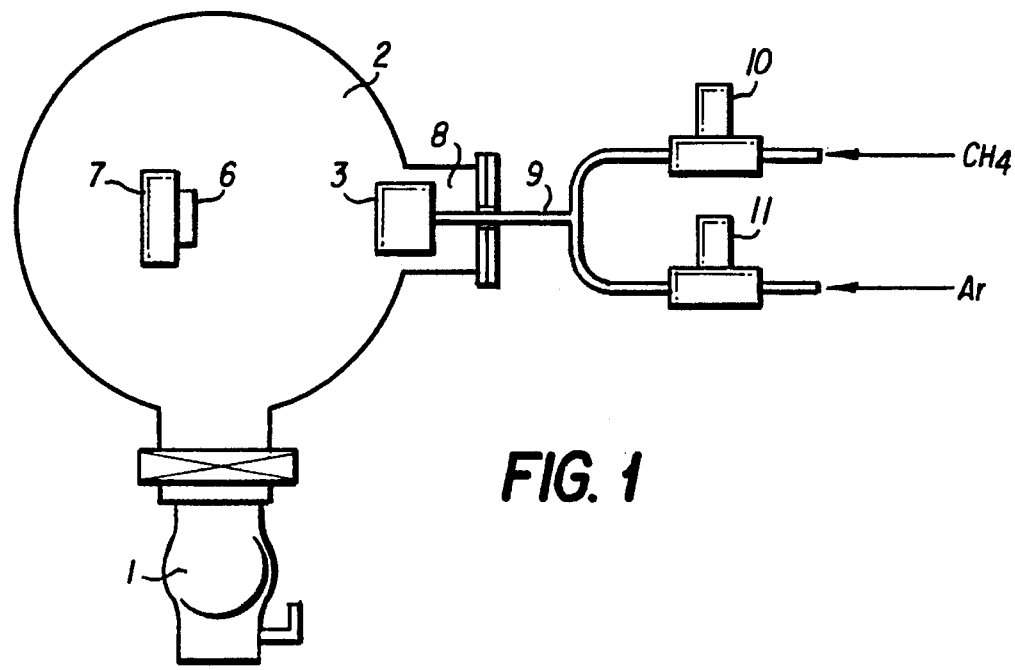
FIG. 1 is a diagrammatic representation of a system in which the subject process invention may be performed according to the best mode.

Referring now to the drawings wherein like numerals indicate like elements through the several views, systems suitable for performing the present process invention are illustrated in FIGS. 1a, 1b. In FIG. 1, vacuum pump 1 which is a Varian VHS-6 diffusion pump is used to evacuate the vacuum chamber 2. One suitable vacuum chamber is the Commonwealth Scientific Corporation model 18×20Φ chamber. Mounted in the chamber 2 is an end-Hall ion source 3 sold by Commonwealth Scientific Corp. under the model name "Mark II," and shown in greater detail in FIG. 3. A substrate 6 upon which a-C:H is to be deposited and a mounting stage 7 for substrate 6 is located inside the chamber 2 in front of the end-Hall ion source 3. Stage 7 is moveable, rotatable, cooled and provides for variable angle of ion incidence upon the substrate. A Commonwealth Scientific Corp. model 1802 stage is preferred. Connected to the end-Hall ion source is a gas feed pipe 8 and, upstream of that, a gas metering and mixing manifold 9 of conventional type. The gas manifold consists of one commercial mass flow controller 10 for the hydrocarbon feedstock gas, preferably methane ($CH_4$), and a second mass flow controller 11 for argon gas for argon ion bombardment cleaning of the substrate 6 prior to a-C:H deposition. Outside the chamber 2, the end-Hall ion source 3 is electrically connected to an appropriate power supply (not shown) which preferably is a "Mark II Source Controller" sold by Commonwealth Scientific Corp.

In operation, one or more substrates, such as 3 inch diameter n-doped electronic grade silicon wafers polished with the <100> crystal plane at the surface, are secured to stage 7 and vacuum pump 1 is used to evacuate the chamber to a desired preprocess pressure of about $1\times10^{-4}$ to $1\times10^{-3}$ Pa. This serves to substantially remove atmospheric gases from the system and to partially clean the surfaces of the ion sources and the silicon substrate 6 upon which a-C:H is to be deposited. Cooling of stage 7 is started in order to keep substrate 6 at a desired temperature. During the deposition process, the substrate heats up under ion bombardment power and radiant heat provided by the end-Hall effect ion source in the absence of external cooling. For deposition of thin a-C:H films, the temperature of the substrate is maintained below about 100° C.

Stage 7 is rotated at about 3 rpm. The gas flow of 10 sccm is initially established for the end-Hall source 3 and the total gas flow is adjusted such that the pressure in the exit aperture of end-Hall source 3 ranges between $2\times10^{-2}$ to $2\times10^{-1}$ Pa. The gas flow required to achieve this pressure depends upon the effective pumping speed of the pump 1. Once the proper flow has been established, the discharge in the end-Hall source 3 is initiated by the electrical power supply (not shown). One preferred set of operating parameters used to produce an electron-emissive a-C:H material with the end-Hall ion source 3 is as follows: $flow_{methane}$=20 sccm, $I_{cathode\ heater}$=28 amps, $V_{anode}$=90 volts, $I_{anode}$=1.0 amp and $I_{neutralizer\ emission}$=−0.45 amps. A period of several seconds to several minutes of source operation is initially allowed before substrate 6 is exposed to any ion source. Upon initial operation of the end-Hall source 3, after the chamber has been opened to the atmosphere, end-Hall source 3 heats up and desorbs water vapor and other atmospheric gases previously adsorbed on its component parts. A desorption of atmospheric gases from the interior surfaces of the vacuum chamber is also experienced. Sufficient time is allowed to permit pump 1 to remove the majority of desorbed gases from the system so that deposition of a a-C:H film of higher purity is achieved. However, in some instances, satisfactory a-C:H can be obtained without this degassing step, indicating that at least some types of a-C:H are relatively insensitive to typical vacuum chamber contaminants.

The current density of the end-Hall source 3 is about 0.2 $mA/cm^2$ with the above-described end-Hall source settings.

As the substrate 6 is rotated facing normal to the end-Hall ion source 3, deposition begins and continues for 4.5 minutes until a desired a-C:H thickness of 660 Å is built up, at which time source 3 is turned off.

After a cooling down time of about five minutes, vacuum pump 1 is isolated from the deposition chamber 2. The chamber is then filled with dry nitrogen gas until its pressure equalizes with the external atmosphere. The chamber is then opened and the coated substrates were removed from the stage.

The resulting a-C:H film is moderately hard having a 8 GPa nano-indentation hardness[1]. For comparison the silicon upon which it was deposited measured 10 GPa. the film is moderately electrically conductive having a resistivity[2], of 1:1±0.5 ohm.cm and a sheet resistance of $3.5\pm0.5\times10^4$ ohm/sq. This compares with a sheet resistance of 120 ohm/sq for the n-type doped silicon wafer upon which the a-C:H was deposited. The electron emissivity was measured using apparatus consisting of a 2 mm diameter tungsten carbide ball-shaped probe mounted on a thin rod. The probe was moveable with 0.1 μm precision toward and away from The surface of the specimen to be tested, along the surface normal. At a given probe-to-specimen distance, an electronic circuit was programmed to sweep the applied DC voltage between the specimen and the probe from zero up to a preset value while simultaneously recording the electrical current that flowed. Measurements were performed in air at probe-to-specimen spacings on the order 5 μm. The threshold of electron emission for the a-C:H film was at an applied field of approximately 15 volts/μm. The a-C:H film emitted at 1

μA at 20 volts/μm. By comparison a typical silicon wafer emitted 1 μA at 80 volts/μm and a copper surface polished to a 125 rms finish emitted at 1 μA at 112 volts/μm.

[1]Hardness measurements were conducted by Nano Instruments, Inc. of Knoxville, Tenn. using a "Nano Indenter II."
[2]Electrical resistance measurements were performed on an Advanced Semiconductor Materials, Inc. model AFPP-I four point probe.

ALTERNATE MODE FOR CARRYING OUT THE INVENTION

Figure 2:
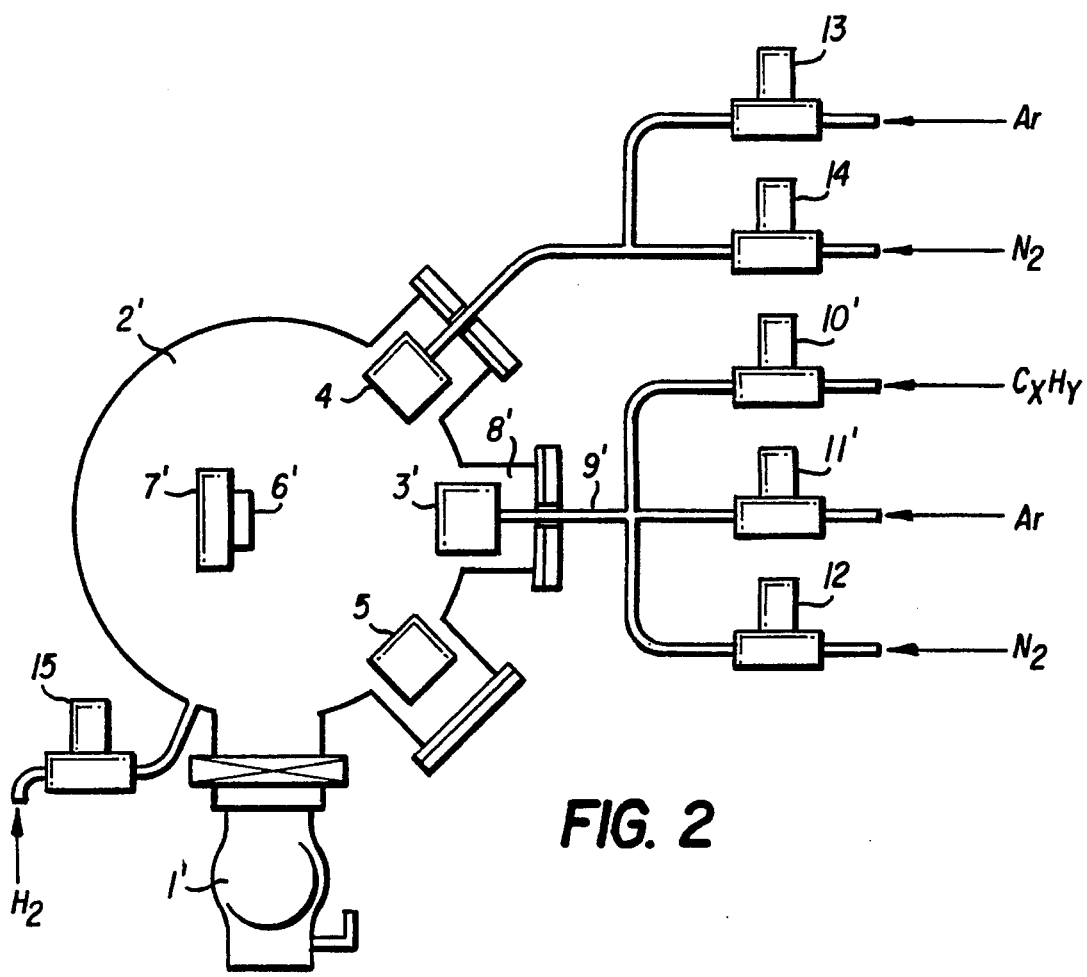
FIG. 2 is a diagrammatic representation of a system in which the subject process invention may be performed according to an alternate mode.

Referring now to FIG. 2, there is illustrated an alternate mode for carrying out the process of the present invention. The vacuum system used for performing the alternate process is identical to the system shown in FIG. 1 as is the end-Hall ion source 3'. In this mode, a second ion source 4 and, a deposition source 5 are also mounted in the vacuum chamber 2'.

The second ion source 4 is a Kaufman-type dual-gridded broad beam ion source with suitable grid diameter to irradiate the substrate substantially uniformly with gaseous ions. Ion energies in the range of 200 to 500 eV are used and ion current densities at the substrate range from 0.01 to 0.2 mA/cm$^2$. The deposition source 5 may be of several sorts, e.g., an ion beam sputter deposition unit, a magnetron sputtering head, an electron beam evaporator, a plasma source for dissociation and deposition of silane, as well as others.

A three-inch (3") diameter silicon substrate 6', upon which a-C:H is to be deposited is secured to stage 7 inside chamber 2' in front of the end-Hall ion source 3'. Stage 7' is moveable and rotatable to provide a variable angle of ion incidence upon the substrate. A temperature sensor is provided for measuring the temperature of substrate 6', improving the thermal contact between the stage and the substrate and controlling the temperature of the substrate by either heating or cooling the stage 7'. Connected to the end-Hall ion source 3' is a gas feed pipe 8' and, upstream of that, a gas metering and mixing manifold 9' of conventional type. The gas manifold consists of one commercial mass flow controller 10' for the hydrocarbon feedstock gas and, optionally, a second mass flow controller 11' for argon gas for argon ion bombardment cleaning of the substrate prior to a-C:H deposition. A third mass flow controller 12 is employed for mixing nitrogen with the hydrocarbon feedstock gas in order to dope the a-C:H film with nitrogen. Connected to the second ion source 4 is a mass flow controller 13 for generating an argon ion beam for cleaning the substrate prior to a-C:H deposition and/or for argon ion bombardment of the substrate during a-C:H deposition. Also connected to the second ion source 4 is a mass flow controller 14 for generating nitrogen or a mixture of nitrogen and argon ion beam with which to dope the a-C:H with nitrogen. Gas inlet and mass flow controller 15 is provided to admit hydrogen gas into the chamber during deposition to help prevent formation of graphitelike chemical bonds. Outside the vacuum chamber, each ion source or deposition source is electrically connected to an appropriate power supply (not shown).

The operation of the alternate mode is substantially identical to that of the best mode except for the following: Nitrogen doping of the a-C:H is carried out by mixing nitrogen gas with methane to the end-Hall source 3'. A ratio of 1:100 to 10:100 (nitrogen:methane) is preferred. The total gas flow to the end-Hall source should be such that the pressure in the exit aperture of the source $2 \times 10^{-2}$ to $2 \times 10^{-1}$ Pa. This is achieved by pump 1' For the second ion source, a flow of pure argon, a flow of pure nitrogen or a flow of mixed argon and nitrogen is provided, such that, the partial pressure of this gas is $1 \times 10^{-2}$ to $1 \times 10^{-1}$ Pa just outside the grids of the source. These gases/mixtures provide an ion beam that performs ion-assisted deposition of the a-C:H, and the nitrogen-containing ions will dope the a-C:H with nitrogen. Once gas flow has been established to each source, the discharge in each source is started by operating the electrical power supply for the source as provided for by the manufacturer of the sources. The remaining process steps used are identical to those described in connection with the best mode.

The process according to the alternate mode of the present invention yields an improved diamond-like, electrically conductive and electron-emissive carbon based film having substantially identical properties to that produced by the best mode contemplated. However, the alternate mode appears to be more favorable for producing hard, optically transparent films than for producing electron-emissive films.

Figure 3:
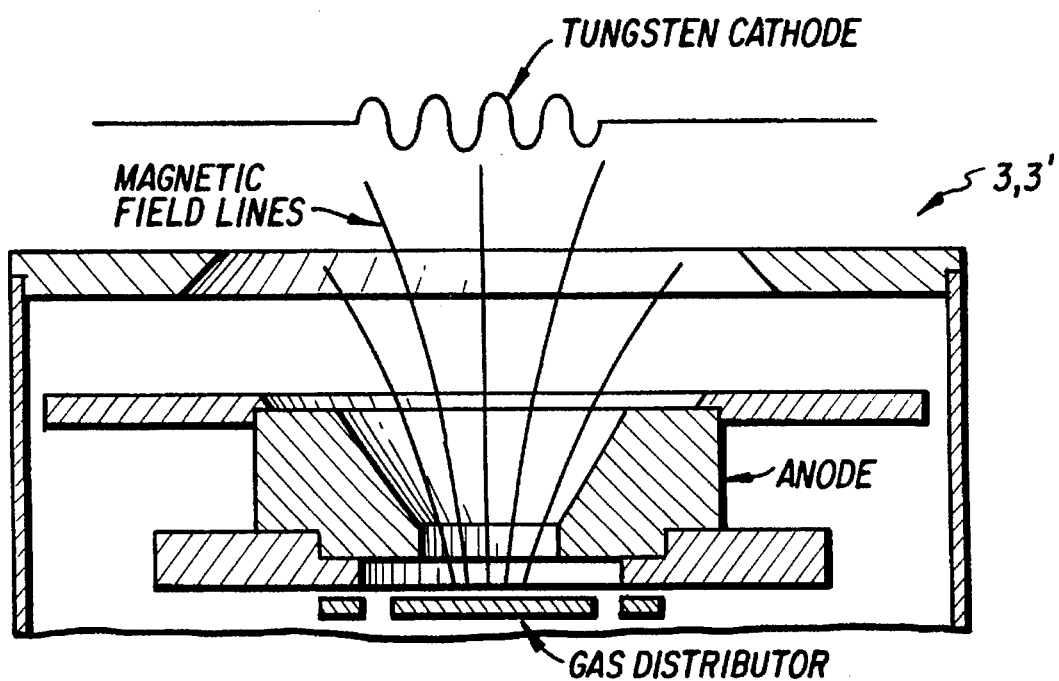
FIG. 3 is a cross sectional view of an end-Hall ion source used in the process of the present invention.

The end-Hall ion source shown in FIG. 3 which, used in the present process, is known in the prior art. Further details can be seen in the Cuomo et al and Kaufman et al patents cited in "Background" portion of the specification.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A process for depositing a carbon containing film, such as, amorphous carbon (a-C), amorphous hydrogenated carbon (a-C:H), or, diamondlike carbon (DLC) film on a substrate using an end-Hall ion source, comprising the steps of:

a. providing an end-Hall ion source in a vacuum chamber;

b. providing a substrate to be coated within said chamber; and c. introducing a carbon containing gas into said end-Hall source and forming a carbon containing plasma;

d. controlling the ion energy of said carbon containing plasma and depositing onto said substrate a carbon containing film having electrically conductive and electron-emissive properties, or, high hardness, low electrical conductivity and optical transparent properties, or, a combination of both, depending on the ion energy utilized.

2. A process as in claim 1 including the step of providing an electron source in the end-Hall source.

3. A process as in claim 2 wherein a hollow cathode electron source is used as the electron source.

4. A process as in claim 2 wherein a plasma bridge electron source is used as the electron source.

5. A process as in claim 1 further including the steps of providing a argon ion source and precleaning said substrate by argon ion bombardment before carbon deposition is carried out.

6. A process as in claim 1 further including the steps of providing an ion source and employing argon ion bombardment during carbon deposition for the purpose of adding energy to the deposited film.

7. A process as in claim 1 further including the step of adding hydrogen gas to the carbon containing plasma during carbon deposition for the purpose of reducing graphitelike bonding of said film.

8. A process as in claim 1 further including the step of adding nitrogen gas during carbon deposition for the purpose of doping said carbon containing film with nitrogen to improve the mechanical and electrical properties of said deposited film.

9. A process as in claim 1 wherein said carbon containing gas is a hydrocarbon.

10. A process as in claim 9 wherein said hydrocarbon is taken from the group consisting of methane, ethane, propane, butane, ethylene, propylene, accetylene and mixtures thereof.

11. A process as in claim 9 wherein said hydrocarbon gas is methane.

12. A process as in claim 1 wherein said substrate is taken from the group consisting of ceramics, semiconductors, glass, metals, polymers, papers.

13. A process as in claim 1 wherein said substrate is a semiconductor taken from the group consisting of silicon, germanium, gallium arsanide.

14. A process as in claim 13 wherein said substrate is silicon.

15. A product made in accordance with the process of claim 1.

16. A coated substrate made in accordance with the process of claim 1.

17. The process according to claim 1, further including the step of maintaining a constant current density throughout the depositing of the carbon containing film on said substrate.

18. The process according to claim 17, wherein the value of said constant current density ranges from about 0.2 to 1 mA/cm$^2$.

19. The process according to claim 17, wherein the value of said constant current density is about 0.2 mA/cm$^2$ or more.

20. The process according to claim 18, wherein the deposition rate of said film ranges from 500 Å/min to 2,000 Å/min.

21. A coated substrate made in accordance with the process of claim 17, having a film thickness of from about 10 Å to about 20 micrometers.

22. A coated substrate made in accordance with the process of claim 19, having a film thickness of from about 10 Å to about 20 micrometers.

23. The coated substrate of claim 21, wherein said carbon containing film has an 8 GPa nano-indentation hardness rating.

24. The coated substrate of claim 21, wherein said carbon containing film has a resistivity of 1.1±0.5 ohm cm.

25. The coated substrate of claim 23, wherein said carbon containing film has a resistivity of 1.1±0.5 ohm cm.

26. The coated substrate of claim 21, wherein said carbon containing film emits electrons at 1 µA at 20 volts/µm.

27. The coated substrate of claim 23, wherein said carbon containing film emits electrons at 1 µA at 20 volts/µm.

28. The coated substrate of claim 24, wherein said carbon containing film emits electrons at 1 Å at 20 volts/µm.

29. The process according to claim 1 wherein the ion energy provided by said end-Hall source is defined by a $V_{anode}$ value of between about 90 eV to about 150 eV.

30. The process according to claim 1 wherein the ion energy provided by said end-Hall source is defined by a $V_{anode}$ value of about 90 eV to produce a carbon containing film on said substrate characterized as having softer and electron emissive properties.

31. The process according to claim 17 wherein the ion energy provided by said end-Hall source is defined by a $V_{anode}$ value of about 90 eV to produce a carbon containing film on said substrate characterized as having softer and electron emissive properties.

32. The process according to claim 1 wherein the ion energy provided by said end-Hall source is defined by a $V_{anode}$ value of about 150 eV to produce a carbon containing film on said substrate characterized as having hard and non-electron emissive properties.

33. The process according to claim 1 further including the step of combining a second ion source with said first ion source to increase the ion energy of said plasma so as to produce a carbon containing deposited film having hard and non-electron emissive properties.

34. The process according to claim 1, wherein the rate of deposition of said carbon film is at least 146 Å/min.

* * * * *

UNITED STATES PATENT AND TRADEMARK OFFICE
Certificate

Patent No. 5,616,179

Patented: April 1, 1997

On petition requesting issuance of a certificate for correction of inventorship pursuant to 35 U.S.C. 256, it has been found that the above identified patent, through error and without deceptive intent, improperly sets forth the inventorship.

Accordingly, it is hereby certified that the correct inventorship of this patent is: Bradley J. Knapp, Kutztown, PA; Fred M. Kimock, Macungie, PA; David A. Baldwin, Annandale, VA; and Stephen L. Michel, Alexandria, VA.

Signed and Sealed this Fifteenth Day of May, 2001.

BENJAMIN L. UTECH
*Supervisory Patent Examiner*
Art Unit 1765